United States Patent
Jindal et al.

(10) Patent No.: US 9,599,673 B2
(45) Date of Patent: Mar. 21, 2017

(54) STRUCTURAL TESTING OF INTEGRATED CIRCUITS

(71) Applicants: Anurag Jindal, Patiala (IN); Nipun Mahajan, New Delhi (IN)

(72) Inventors: Anurag Jindal, Patiala (IN); Nipun Mahajan, New Delhi (IN)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 330 days.

(21) Appl. No.: 14/514,402

(22) Filed: Oct. 15, 2014

(65) Prior Publication Data

US 2016/0109514 A1    Apr. 21, 2016

(51) Int. Cl.
| | |
|---|---|
| *G01R 31/3177* | (2006.01) |
| *G01R 31/3185* | (2006.01) |
| *G01R 31/40* | (2014.01) |
| *G01R 31/319* | (2006.01) |
| *G01R 31/317* | (2006.01) |

(52) U.S. Cl.
CPC .. *G01R 31/318572* (2013.01); *G01R 31/3172* (2013.01); *G01R 31/31908* (2013.01)

(58) Field of Classification Search
CPC ........ G01R 31/318572; G01R 31/3172; G01R 31/31908; G01R 31/318547; G01R 31/318536

See application file for complete search history.

(56) References Cited

U.S. PATENT DOCUMENTS

| | | | | |
|---|---|---|---|---|
| 5,371,417 | A  * | 12/1994 | Mirov | G06F 1/06 327/115 |
| 5,490,151 | A | 2/1996 | Feger | |
| 6,055,587 | A | 4/2000 | Asami | |
| 6,324,666 | B1 | 11/2001 | Nakamoto | |
| 6,374,370 | B1 | 4/2002 | Bockhaus | |
| 6,496,966 | B1 | 12/2002 | Barney | |
| 6,751,762 | B2 | 6/2004 | Antonischki | |
| 6,829,740 | B2 | 12/2004 | Rajski | |
| 6,857,091 | B2 * | 2/2005 | Amirfathi | G01R 31/318555 714/724 |
| 7,032,148 | B2 | 4/2006 | Wang | |
| 7,313,746 | B2 | 12/2007 | Chao | |

(Continued)

*Primary Examiner* — April Y Blair
*Assistant Examiner* — Dipakkumar Gandhi
(74) *Attorney, Agent, or Firm* — Charles E. Bergere

(57) ABSTRACT

An integrated circuit (IC) that is operable in scan test and functional modes includes scan-in pads, scan-out pads, scan chains, a compressor, a decompressor, a test control register, and a scan controller. The scan controller includes a multiple input shift register (MISR), an inverter, and multiple logic gates. The scan-in and scan-out pads receive scan test data and masking signals, respectively. The decompressor provides decompressed scan test data to the scan chains, which generate functional responses based on the decompressed scan test data. The compressor provides compressed functional responses to the scan controller. The logic gates receive the compressed functional responses and the masking signals from the compressor and the corresponding scan-out pads, respectively, and generate corresponding masked signals. The masking signals mask non-deterministic values in the decompressed functional responses. The MISR receives the masked signals and generates an error free signature.

8 Claims, 4 Drawing Sheets

(56) References Cited

U.S. PATENT DOCUMENTS

| | | | |
|---|---|---|---|
| 7,596,733 B2 | 9/2009 | Kapur | |
| 7,743,301 B2* | 6/2010 | Sawai | G01R 31/31703 365/201 |
| 7,925,947 B1 | 4/2011 | Touba | |
| 8,004,908 B2 | 8/2011 | Asano | |
| 8,166,359 B2 | 4/2012 | Rajski | |
| 8,286,040 B2 | 10/2012 | Malach | |
| 2003/0056165 A1 | 3/2003 | Whetsel | |
| 2003/0115525 A1* | 6/2003 | Hill | G01R 31/318547 714/726 |
| 2004/0133832 A1 | 7/2004 | Williams | |
| 2005/0060625 A1* | 3/2005 | Wang | G01R 31/318547 714/727 |
| 2005/0268194 A1* | 12/2005 | Wang | G01R 31/318547 714/733 |
| 2007/0067688 A1* | 3/2007 | Vranken | G01R 31/31719 714/733 |
| 2007/0283200 A1* | 12/2007 | Casarsa | G01R 31/318536 714/724 |
| 2009/0271674 A1 | 10/2009 | Whetsel | |
| 2010/0090706 A1 | 4/2010 | Malach | |
| 2012/0137187 A1* | 5/2012 | Jain | G01R 31/318566 714/731 |
| 2015/0234010 A1* | 8/2015 | Kim | G01R 31/31703 714/735 |

* cited by examiner

STRUCTURAL TESTING OF INTEGRATED CIRCUITS

BACKGROUND OF THE INVENTION

The present invention relates generally to integrated circuits, and, more particularly, to structural testing of integrated circuits.

Integrated circuits (ICs) integrate various analog and digital components on a single chip. Such ICs may contain manufacturing defects caused by, for example, dust particle contamination during fabrication, which can cause the IC to function incorrectly. Thus, testing ICs to detect manufacturing defects is essential. Design for test (DFT) is a technique that adds testability features to an IC to identify manufacturing defects. DFT enables an automatic-test-equipment (ATE) to execute various fault tests on the IC. The ATE uses test patterns generated by test pattern generators, such as automatic test pattern generators (ATPG), pseudo-random pattern generators (PRPG), and the like, to detect faults in ICs.

DFT automates the detection of design faults and hence reduces the cost and time required for development and execution of the fault tests. DFT techniques include various fault models, such as transition, path delay, and stuck-at fault models. A transition fault model is used to detect a failure of a logic state transition at a particular circuit element of the IC within a specific time period. A path delay fault model calculates a sum of delays at each element in a path within the IC and detects faults by comparing the sum of delays of the path with a delay of a critical path. The stuck-at fault models, such as stuck-at '0' and stuck-at '1' fault models, are used to detect faulty connections between various elements of the IC that cause circuits to be stuck-at a particular logic state, i.e., logic zero or logic one.

Scan testing is a DFT technique. When subjected to scan testing, the IC operates in two modes—a test mode (also referred to as 'shift operation') and a functional mode (also referred to as 'capture operation'). At the beginning of scan testing, the IC is set in the test mode by dividing it into multiple on-chip logic modules. Each logic module is further segmented into scan chains or paths. Digital logic elements (e.g., flip-flops, latches, and registers) of a logic module are connected together, in series, to form the scan chains or paths and are referred to as 'scan cells'. The ATE provides a first serial test pattern to the scan cells via scan-in pads. Subsequently, the IC is switched to the functional mode, where the scan cells generate test responses based on the test patterns. The IC is then switched back to the test mode and the test responses of the scan paths are observed in each clock cycle at scan-out pads.

The ATPG uses a gate-level representation of a netlist of the IC to generate the test patterns and hence the test patterns are deterministic. With an increase in the digital components in the IC, the scan cells and faults in the IC increase. As the scan cells increase, to maintain a high scan testing efficiency, more test patterns are required. The ATE stores the test patterns and test responses of the scan chains. However, the ATE has a limited memory and a restricted speed, as well as a fixed number of input/output (IO) pads. Further, as the scan-in pads, scan cells, and scan-out pads function synchronously, shift speeds thereof are limited by the shift speed of the scan-out pads as the shift speed of the scan-out pads is the slowest shift speed among these elements. Thus, the test time increases, thereby increasing manufacturing costs.

One solution to overcome the aforementioned problems of scan testing is the use of an another DFT technique called built-in self-test (BIST). BIST is a self-test mechanism provided in the IC to enable self-checking of logic circuits within the IC. BIST is similar to scan testing, but instead of the ATPG, BIST uses a PRPG, such as a linear feedback shift register (LFSR) for generating pseudo-random test patterns. Since BIST does not require any test patterns to be stored in the ATE for fault testing, BIST may be performed in the field. Further, in-field use of BIST eliminates the need of tester data (test patterns and test responses) storage. BIST uses a multiple input shift register (MISR) to generate a signature of the test responses and therefore uses just single scan-out pad to output the signature. For example, BIST procedures are often integrated in ISO 26262 standard compliant automotive devices where in-field testing of a device features is crucial. However, the pseudo-random test patterns applied used during BIST do not provide sufficient fault coverage in a limited time period to locate "hard to detect" faults. Further, BIST does not provide a method to avoid the corruption of the signature with non-deterministic values (also referred to as 'unknown values' or 'X values').

Another scan testing technique to overcome the tester memory limitation problem is test compression, where the IC will include compression and decompression circuitry for compressing test data and decompressing test patterns. Test compression conforms to conventional design rules and hence, can be easily implemented in an IC.

For a given logic design, an increase in the number of scan chains can shorten the length of each scan chain, resulting in a reduction of time required to shift each test pattern, which can reduce test pattern scan out time.

Despite the above techniques, since the number of components and transistors on a chip has increased dramatically, and is continuing to increase, it would be advantageous to have an IC that can be tested reasonably quickly, can be tested in the field, and does not require large volumes of test data.

BRIEF DESCRIPTION OF THE DRAWINGS

The following detailed description of the preferred embodiments of the present invention will be better understood when read in conjunction with the appended drawings. The present invention is illustrated by way of example, and not limited by the accompanying figures, in which like references indicate similar elements.

DETAILED DESCRIPTION

Figure 1:
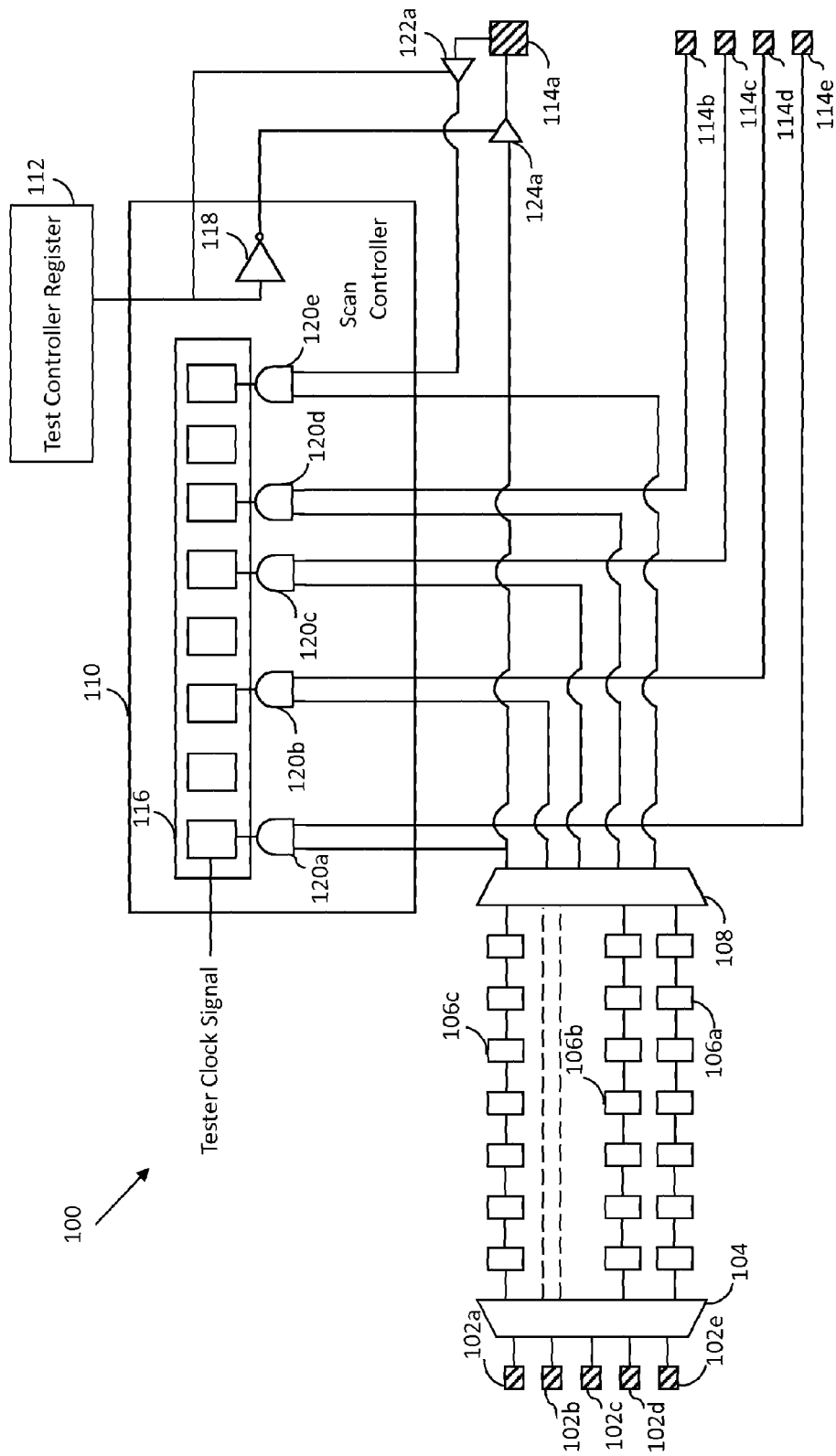
FIG. 1 is a schematic block diagram of an integrated circuit (IC) operable in scan test and functional modes in accordance with an embodiment of the present invention.

The detailed description of the appended drawings is intended as a description of the currently preferred embodiments of the present invention, and is not intended to represent the only form in which the present invention may be practiced. It is to be understood that the same or equivalent functions may be accomplished by different embodiments that are intended to be encompassed within the spirit and scope of the present invention.

In an embodiment of the present invention, an integrated circuit operable in scan test and functional modes when connected to an automated test equipment (ATE) for testing the integrated circuit is provided. The integrated circuit includes first and second sets of input/output (IO) pads, a decompressor, a plurality of scan chains, a compressor, and a scan controller. The first set of IO pads is connected to the ATE for receiving a plurality of test patterns when the integrated circuit is in the scan test mode. The decompressor is connected to the first set of IO pads, for receiving and decompressing the plurality of test patterns and generating a corresponding plurality of decompressed test patterns when the integrated circuit is in the scan test mode. The plurality of scan chains is connected to the decompressor, for receiving the plurality of decompressed test patterns and generating a corresponding plurality of test responses when the integrated circuit is in the functional mode. The compressor is connected to the plurality of scan chains for receiving and compressing the plurality of test responses and generating a plurality of compressed test responses when the integrated circuit is in the scan test mode. The second set of IO pads is connected to the ATE for receiving a plurality of masking signals when the integrated circuit is in the scan test mode. The scan controller is connected to the compressor and includes a plurality of logic gates and a multiple input shift register (MISR). Each logic gate of the plurality of logic gates has a first input terminal connected to the compressor for receiving a compressed test response of the plurality of compressed test responses, a second input terminal connected to an IO pad of the second set of IO pads for receiving a masking signal of the plurality of masking signals, and an output terminal for outputting a masked signal based on a logic state of the masking signal when the integrated circuit is in the scan test mode. The MISR has a clock input terminal connected to the ATE, for receiving a tester clock signal, and a plurality of input terminals, each connected to a corresponding output terminal of the plurality of logic gates, for receiving masked signals generated by each of the plurality of logic gates and generating a signature such that a non-deterministic value of a compressed test response is masked when the integrated circuit is in the scan test mode.

In another embodiment of the present invention, an integrated circuit operable in scan test and functional modes when connected to an ATE for testing the integrated circuit is provided. The integrated circuit includes a set of IO pads, a plurality of flip-flops, a decompressor, a plurality of scan chains, a compressor, and a scan controller. The set of IO pads is connected to the ATE, for receiving a plurality of test patterns and a plurality of masking signals when the integrated circuit is in the scan test mode. Each flip-flop of the plurality of flip-flops has a clock input terminal connected to the ATE for receiving a tester clock signal, an input terminal connected to a corresponding IO pad of the set of IO pads for receiving a test pattern of the plurality of test patterns, and an output terminal for outputting a synchronized test pattern when the integrated circuit is in the scan test mode. The decompressor is connected to the output terminals of the plurality of flip-flops, for receiving and decompressing synchronized test patterns generated by each of the plurality of flip-flops and generating a corresponding plurality of decompressed test patterns when the integrated circuit is in the scan test mode. The plurality of scan chains is connected to the decompressor, for receiving the plurality of decompressed test patterns and generating a corresponding plural-ity of test responses when the integrated circuit is in the functional mode. The compressor is connected to the plurality of scan chains for receiving and compressing the plurality of test responses and generating a plurality of compressed test responses when the integrated circuit is in the scan test mode. The scan controller is connected to the compressor and includes a plurality of logic gates and a multiple input shift register (MISR). Each logic gate of the plurality of logic gates has a first input terminal connected to the compressor for receiving a compressed test response of the plurality of compressed test responses, a second input terminal connected to an IO pad of the set of IO pads for receiving a masking signal of the plurality of masking signals, and an output terminal for outputting a masked signal based on a logic state of the masking signal when the integrated circuit is in the scan test mode. The MISR has a clock input terminal connected to the ATE for receiving the tester clock signal, a plurality of input terminals, each connected to a corresponding output terminal of the plurality of logic gates for receiving masked signals generated by each of the plurality of logic gates and generating a signature such that a non-deterministic value of a compressed test response is masked when the integrated circuit is in the scan test mode.

Various embodiments of the present invention provide an integrated circuit that is operable in scan test and functional modes. The integrated circuit is connected to an ATE for testing the integrated circuit. In an embodiment of the present invention, the integrated circuit includes first and second sets of IO pads, a decompressor, a plurality of scan chains, a compressor, and a scan controller. The scan controller includes a plurality of logic gates and a multiple input shift register (MISR). The first set of IO pads is connected to the ATE for receiving a plurality of test patterns. The second set of IO pads receives a plurality of masking signals. In another embodiment of the present invention, the integrated circuit includes a single set of IO pads and a plurality of flip-flops. The set of IO pads is connected to the ATE for receiving the plurality of test patterns and the plurality of masking signals. The plurality of flip-flops is connected to the set of IO pads for generating synchronized test patterns and synchronized masking signals. The decompressor decompresses the test patterns and provides the decompressed test patterns to the plurality of scan chains. The scan chains generate corresponding test responses based on the test patterns. The compressor compresses the test responses and provides corresponding compressed test responses to the plurality of logic gates. Further, the plurality of logic gates receive the plurality of masking signals and generate masked signals. The MISR generates a signature based on the masked signals such that non-deterministic values in the test responses are masked. As the non-deterministic values in the test responses are masked and a signature is generated for multiple patterns together, there is a reduction in tester data volume (test patterns and test responses) volume that is stored for comparison of the signature with an ideal signature in the ATE. In the aforementioned embodiment of the present invention, as both the first and second sets of IO pads are configured as input pads, there is an increase in shift speed of the test patterns and the masking signals, resulting in reduced testing time of the integrated circuit. In the alternative embodiment, as a single set of IO pads is used for receiving both the test patterns and the masking signals, the number of IO pads required for scan testing is reduced to half. Thus, the scan testing time and the tester data volume are reduced, which in turn reduce the manufacturing cost of the integrated circuit.

Referring now to FIG. 1, an integrated circuit (IC) 100 operable in scan test and functional modes in accordance with an embodiment of the present invention is shown. The IC 100 is connected to an ATE (not shown) that performs scan testing of the IC 100. The IC 100 is operable in the scan test mode (also referred to as 'shift operation') and the functional mode (also referred to as 'capture operation') and receives a tester clock signal from the ATE. The IC 100 includes first through fifth scan-in pads 102a-102e (a first set of IO pads, collectively referred to as scan-in pads 102), a decompressor 104, scan chains 106a-106c (collectively referred to as scan chains 106), a compressor 108, a scan controller 110, a test control register 112, and scan-out pads 114a-114e (a second set of IO pads, collectively referred to as scan-out pads 114). The scan controller 110 includes a multiple input shift register (MISR) 116, an inverter 118, and first through fifth logic gates 120a-120e. Each scan-out pad 114 is connected to corresponding input and output buffers (not shown). For example, in one embodiment, the scan-out pad 114a is connected to an input buffer 122a and an output buffer 124a. The input and output buffers are collectively referred to as input and output buffers 122 and 124, respectively. The scan chains 106 include multiple scan cells connected to each other. The scan cells are connected to logic circuits in the IC 100 (not shown). Further, the scan cells test the logic circuits. In an embodiment of the present invention, the first through fifth logic gates 120a-120e are AND gates.

The scan-in and scan-out pads 102 and 114 are connected to the ATE for receiving scan test data (also referred to as 'test patterns') and masking signals, respectively. In an embodiment of the present invention, the scan-out pads 114 are configured as scan-in pads. The test control register 112 generates a test mode select signal that configures the scan-out pads 114 as scan-in pads. The decompressor 104 is connected to the scan-in pads 102 for receiving and decompressing the scan test data and outputting corresponding decompressed scan test data. The scan chains 106 are connected to the decompressor 104 for receiving the decompressed scan test data. The scan cells of the scan chains 106 use the decompressed scan test data for testing the logic circuits. The logic circuits receive the decompressed scan test data and generate functional responses (also referred to as 'test responses') based on the scan test data. The compressor 108 is connected to the scan chains for receiving and compressing the functional responses. The compressor 108 is connected to the scan-out pads 114 and the scan controller 110.

The inverter 118 of the scan controller 110 has an input terminal connected to the test control register 112 for receiving the test mode select signal and generating an inverted test mode select signal. The input buffer 122a has a first input terminal connected to the scan-out pad 114a for receiving a masking signal, a second input terminal connected to the test control register 112 for receiving the test mode select signal, and an output terminal for outputting the masking signal. The output buffer 124b has a first input terminal connected to the compressor 108 for receiving the compressed functional response, a second input terminal connected to the output terminal of the inverter 118 for receiving the inverted test mode select signal, and an output terminal connected to the scan-out pad 114a for outputting the compressed functional response. The input and output buffers 122 and 124 corresponding to the second through fifth scan-out pads 114b-114e are connected in a similar way to the test control register 112.

The first through fifth logic gates 120a-120e of the scan controller 110 are connected to the compressor 108 and the input buffers 122. In an example, the fifth logic gate 120e has a first input terminal connected to the compressor 108 for receiving the compressed functional response, a second input terminal connected to the output terminal of the input buffer 122a for receiving the masking signal, and an output terminal for outputting a masked signal in the scan test mode. The MISR 116 has an input clock terminal for receiving the tester clock signal, first through fifth input terminals connected to the corresponding output terminals of the first through fifth logic gates 120a-120e for receiving the masked signals, and an output terminal for outputting a signature. The ATE that is connected to the MISR 116 receives and compares the signature with an ideal signature to determine the faults in the IC 100.

In operation, the scan testing of the IC 100 is controlled by the tester clock signal and the IC 100 operates in three phases, viz., shift-in, capture, and shift-out phases. When the test control register 112 generates the test mode signal at logic high state, the inverter 118 outputs the inverted test mode signal at logic low state. The test control register 112 activates the input buffer 122a by way of the logic high test mode signal and thus configures the scan-out pad 114a as an input pad. Similarly, the logic high test mode select signal activates the corresponding input buffers 122 of the second through fifth scan-out pads 114b-114e and configures the scan-out pads 114 as scan-in pads. In the shift-in phase, the scan-in pad 102a receives the scan test data from the ATE and provides the scan test data to the decompressor 104. Simultaneously, the scan-out pad 114a receives the masking signal from the ATE. The decompressor 104 decompresses the scan test data and provides the decompressed scan test data to the scan chain 106c. In the scan chain 106c, a first scan cell receives the scan test data from the decompressor 104. The scan test data is then shifted through the scan chain 106c till all the scan cells of the scan chain 106c are loaded with the scan test data and the IC 100 is in the shift-in phase. The scan cells provide the scan test data to the corresponding logic circuits connected thereto. The logic circuits generate functional responses based on the scan test data. Thereafter, the IC 100 operates in the capture phase. In the capture phase, the scan cells of the scan chain 106c capture the functional responses of the logic circuits and provide the functional responses to the compressor 108. The compressor 108 generates compressed functional responses and provides the compressed functional responses to the first through fifth logic gates 120a-120e.

In the example, the fifth logic gate 120e receives the compressed functional response and the masking signal from the compressor 108 and the scan-out pad 114a, respectively. The scan-out pad 114a provides the masking signal to the fifth logic gate 120e by way of the input buffer 122a. The ATE provides the masking signal in a predetermined manner to mask any unknown value in the compressed functional responses of the scan chains is masked. When the masking signal is at logic high state, the fifth logic gate 120e outputs the compressed functional response. When the masking signal is at logic low state, the fifth logic gate 120e outputs the logic low masking signal. Thus, an unknown value in the compressed functional response is not provided to the MISR 116 that otherwise would have corrupted the signature generated by the MISR. Moreover, as the scan-out pads 114 are configured as scan-in pads, the shift speed of the masking signal is increased, resulting in a reduced scan testing time. Further, as the ATE stores only two bits of tester data, i.e., logic high and low, corresponding to the scan test data and the masking signal per cycle of the tester clock signal, the tester data volume stored in the ATE is reduced.

Figure 2:
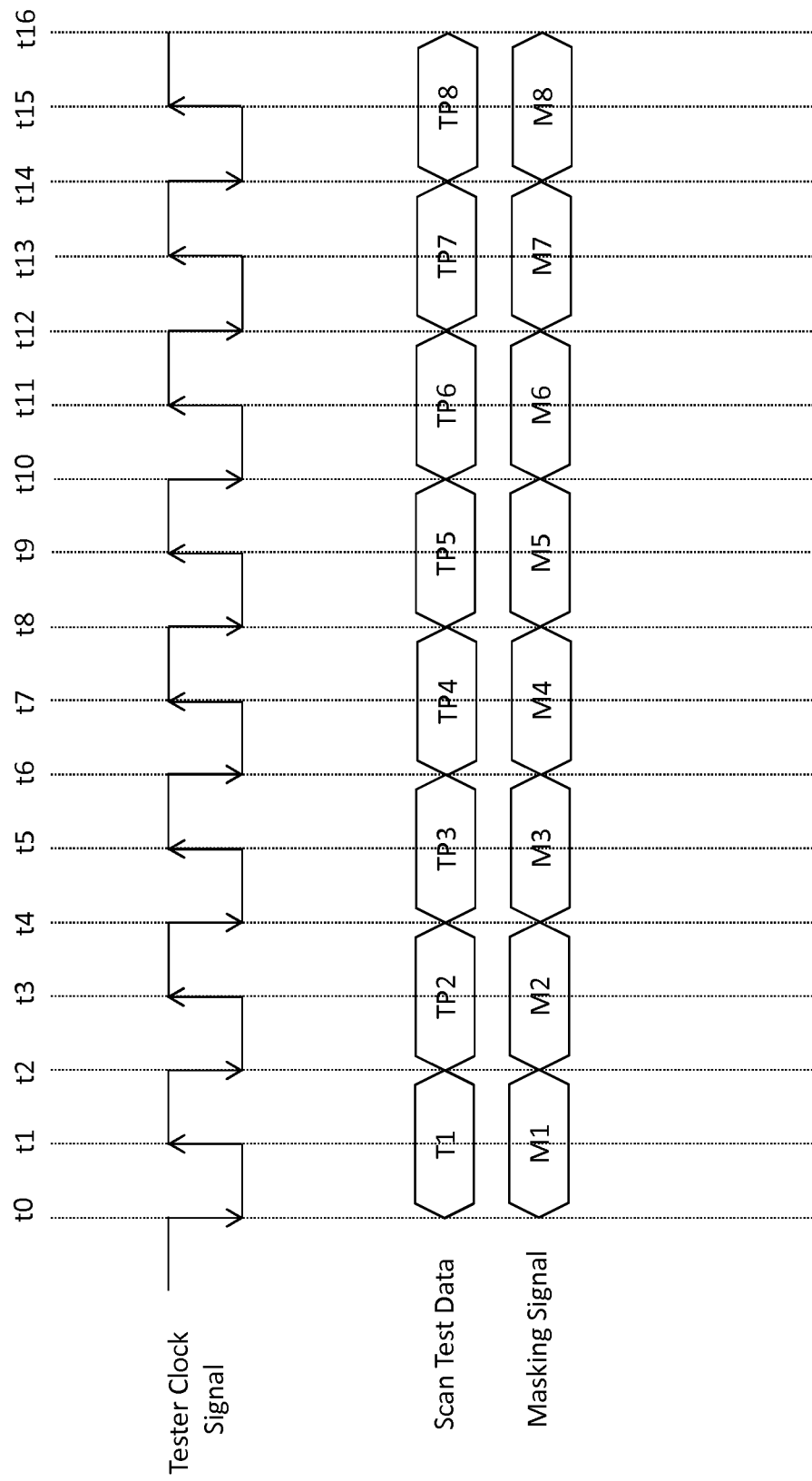
FIG. 2 is a timing diagram of scan testing of the IC of FIG. 1 in accordance with an embodiment of the present invention.

Referring now to FIG. 2, a timing diagram illustrating the scan testing of the IC 100 of FIG. 1 in accordance with an embodiment of the present invention is shown. The tester clock signal, the scan test data, and the masking signal are shown on the timing diagram. At time instant t0 of the tester clock signal, the shift-in phase of the IC 100 is initiated. During the shift-in phase, the scan-in pad 102a receives the scan test data. Further, at time instant t0, the scan-out pad 114a receives and provides the masking signal to the fifth logic gate 120e. The fifth logic gate 120e simultaneously receives the compressed functional response of the scan chain 106c and the masking signal and generates the masked signal. It will be apparent to those skilled in the art that the compressed functional response received at the fifth logic gate 120e at time instant t0 is the functional response that was generated based on the scan test data received in a previous tester clock signal cycle. Thereafter, the aforementioned procedure is repeated at time instants t2, t4, and so on, till the scan testing of the IC 100 is complete.

Figure 3:
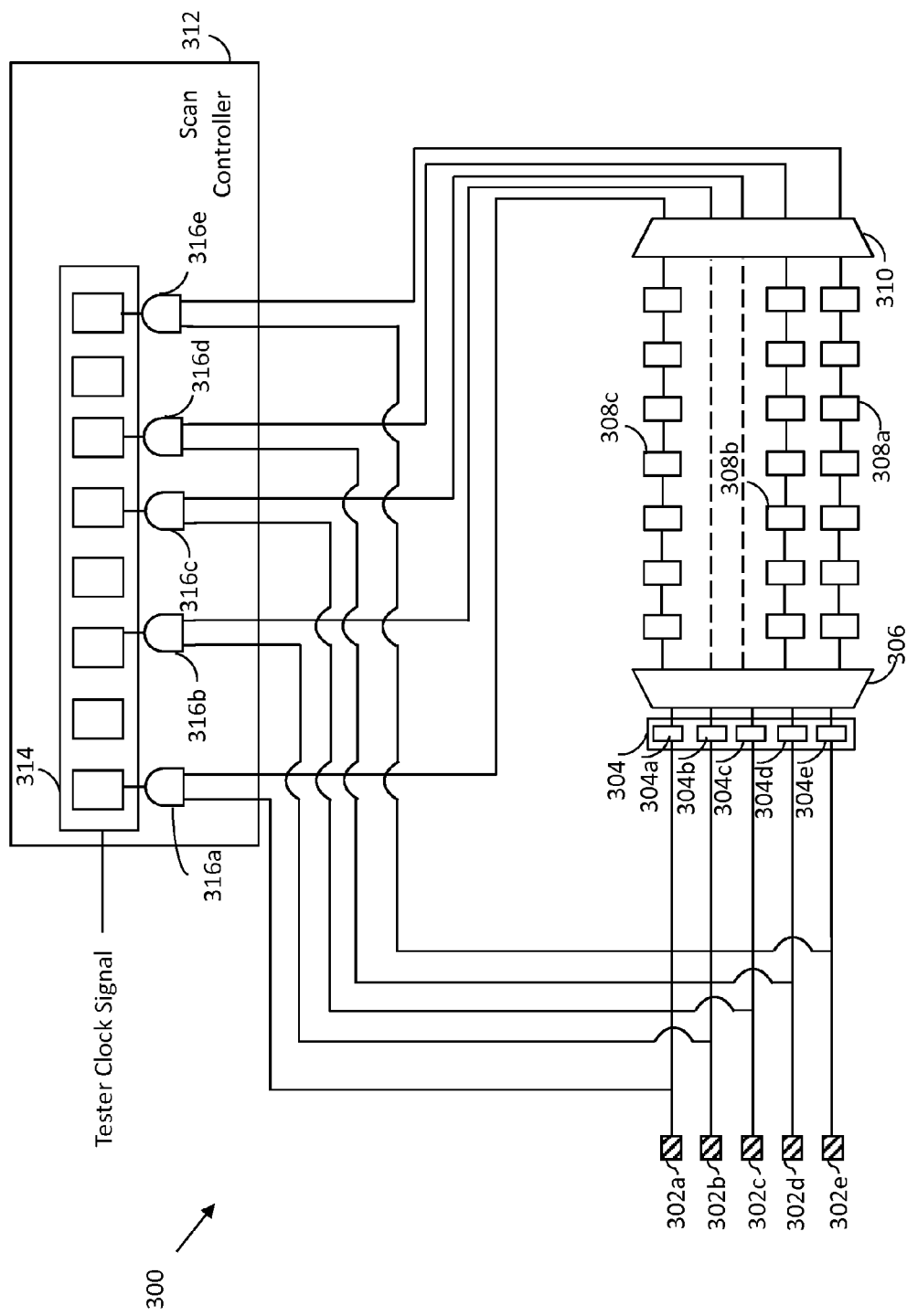
FIG. 3 is a schematic block diagram of an IC operable in the scan test mode in accordance with another embodiment of the present invention.

Referring now to FIG. 3, an IC 300 operable in scan test and functional modes, in accordance with another embodiment of the present invention, is shown. The IC 300 is connected to an automated test equipment (ATE) (not shown) to perform scan testing of the IC 300. The IC 300 is operable in the scan test mode (also referred to as 'shift operation') and a functional mode (also referred to as 'capture operation') and receives a tester clock signal from the ATE. The IC 300 includes first through fifth scan-in pads 302a-302e (collectively referred to as scan-in pads 302), first through fifth flip-flops 304a-304e, a decompressor 306, scan chains 308a-308c (collectively referred to as scan chains 308), a compressor 310, and a scan controller 312. The scan controller 312 includes a multiple input shift register (MISR) 314 and first through fifth logic gates 316a-316e. The scan chains 308 include multiple scan cells connected to each other. Further, the scan cells test logic circuits (not shown) connected thereto in the IC 300. In an embodiment of the present invention, the first through fifth logic gates 316a-316e include AND gates and the MISR 314 is a negative-edge triggered MISR. The first through fifth scan-in pads 302a-302e, the decompressor 306, the scan chains 308a-308c, the compressor 310, and the scan controller 312 correspond to the first through fifth scan-in pads 102a-102e, the decompressor 104, the scan chains 106a-106c, the compressor 110, and the scan controller 110 of the IC 100 of FIG. 1 and hence, operate in a similar manner.

The scan-in pads 302 are connected to the ATE for receiving the scan test data and the masking signals. The first through fifth flip-flops 304a-304e are connected to the corresponding first through fifth scan-in pads 302a-302e for receiving the scan test data and generating synchronized scan test data. The decompressor 306 is connected to the first through fifth flip-flops 304a-304e for receiving and decompressing the synchronized scan test data and outputting corresponding decompressed scan test data. The scan chains 308 are connected to the decompressor 306 for receiving the decompressed scan test data. The scan cells of the scan chains 308 use the scan test data for testing the logic circuits. The logic circuits receive the decompressed scan test data and generate functional responses (also referred to as test responses) based on the decompressed scan test data. The compressor 310 is connected to the scan chains 308 for receiving and compressing the functional responses, and to the scan controller 310. The first through fifth logic gates 316a-316e of the scan controller 312 are connected to the compressor 310 and the corresponding first through fifth scan-in pads 302a-302e. In an example, the first logic gate 316a has a first input terminal connected to the compressor 310 for receiving the compressed functional response, a second input terminal connected to the first scan-in pad 302a for receiving the masking signal, and an output terminal for outputting a masked signal, in the scan test mode. The MISR 314 has an input clock terminal for receiving the tester clock signal, first through fifth input terminals connected to the corresponding output terminals of the first through fifth logic gates 316a-316e for receiving the masked signals, and an output terminal for outputting a signature. The ATE that is connected to the MISR 314 receives and compares the signature therefrom with an ideal signature to determine the faults in the IC 300. The scan testing process of the IC 300 is explained in conjunction with FIG. 4.

Figure 4:
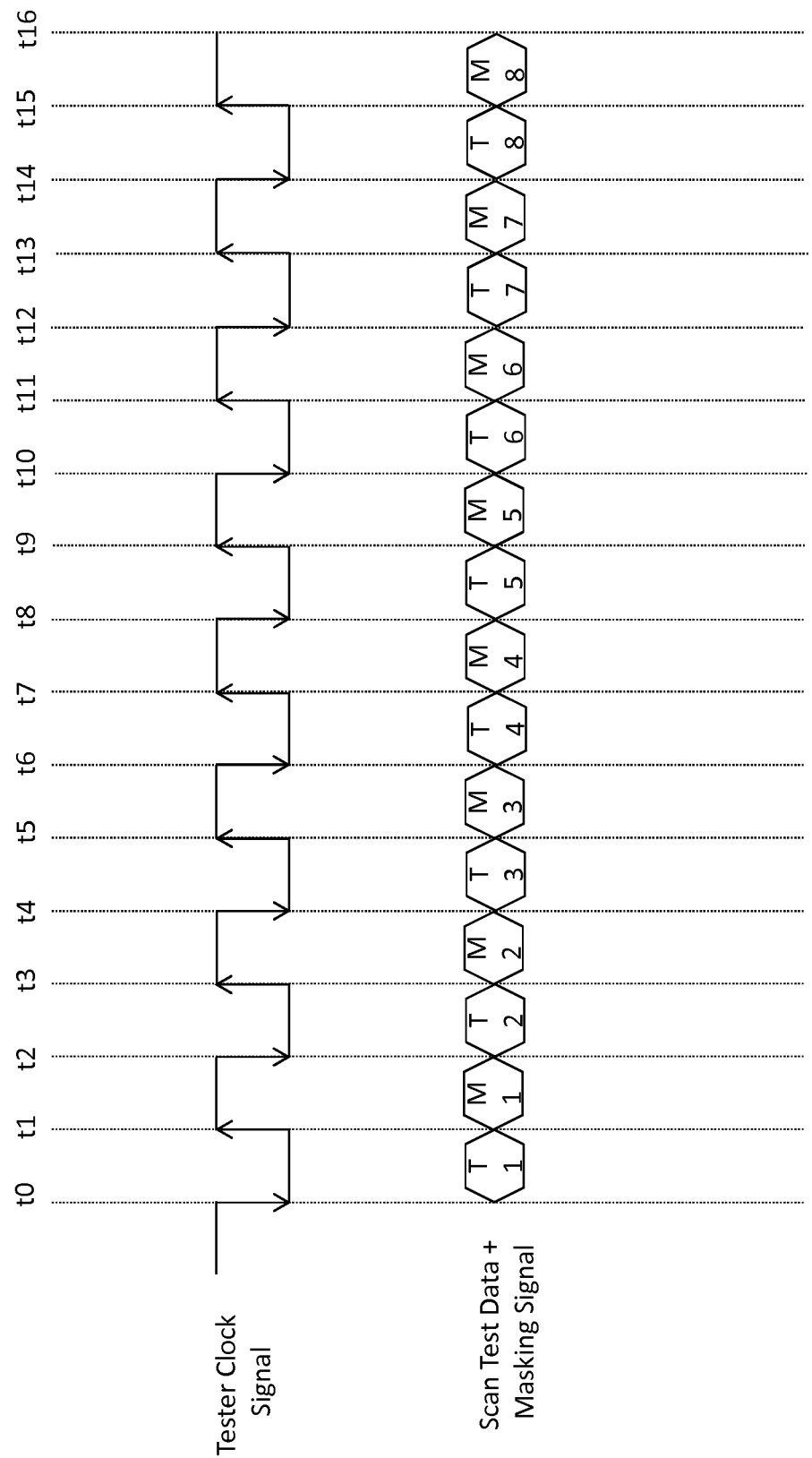
FIG. 4 is a timing diagram of scan testing of the IC of FIG. 2 in accordance with an embodiment of the present invention.

In an example, the scan-in pad 302a receives the scan test data at time instant t0 (negative edge of the tester clock signal) and the masking signal at time instant t1 (positive edge of the tester clock signal), as shown in FIG. 4. The first flip-flop 304a receives the scan test data and generates the synchronized scan test data at time instant t1 (positive edge of the tester clock signal). The decompressor 306 receives the synchronized scan test data and generates the decompressed synchronized scan test data. The scan chain 308a generates the functional response and provides the functional response to the compressor 310. The compressor 310 generates the compressed functional response and provides the same to the first logic gate 316a. The first logic gate 316a receives the compressed functional response and the masking signal from the compressor 310 and the scan-in pad 302a, respectively, and outputs the masked signal at time instant t2. Thus, the MISR 314 samples the masked signals from the first through fifth logic gates 316a-316e at time instant t2 (the negative edge of the tester clock signal). Thereafter, the aforementioned procedure is repeated for subsequent tester clock signal cycles, till the scan testing of the IC 300 is complete. When the masking signal is at logic high state, the first logic gate 316a outputs the compressed functional response. When the masking signal is at logic low state, the first logic gate 316a outputs the logic low masking signal. Thus, an unknown value in the compressed functional response is not provided to the MISR 314 that otherwise would have corrupted the signature generated by the MISR. Moreover, as the scan-out pads are not used in the scan testing process, the shift-speed of the masking signal is increased, resulting in a reduced scan testing time. The absence of scan-out pads further improves tester parallelism. Further, as the ATE stores only two bits of tester data i.e., logic high and low, corresponding to the scan test data and the masking signal per cycle of the tester clock signal, the tester data volume stored in the ATE is reduced.

While various embodiments of the present invention have been illustrated and described, it will be clear that the present invention is not limited to these embodiments only. Numerous modifications, changes, variations, substitutions, and equivalents will be apparent to those skilled in the art, without departing from the spirit and scope of the present invention, as described in the claims.

The invention claimed is:

1. An integrated circuit operable in scan test and functional modes when connected to an automated test equipment (ATE) for testing the integrated circuit, the integrated circuit comprising:
   a first set of input/output (IC) pads, connectable to the ATE for receiving a plurality of test patterns when the integrated circuit is in the scan test mode;

a decompressor, connected to the first set of IO pads, for receiving and decompressing the plurality of test patterns and generating a corresponding plurality of decompressed test patterns when the integrated circuit is in the scan test mode;

a plurality of scan chains, connected to the decompressor, for receiving the plurality of decompressed test patterns and generating a corresponding plurality of test responses when the integrated circuit is in the functional mode;

a compressor, connected to the plurality of scan chains for receiving and compressing the plurality of test responses and generating a plurality of compressed test responses when the integrated circuit is in the scan test mode;

a second set of IO pads, connectable to the ATE for receiving a plurality of masking signals when the integrated circuit is in the scan test mode;

a scan controller, connected to the compressor, including:
  a plurality of logic gates, wherein each logic gate has a first input terminal connected to the compressor for receiving a compressed test response of the plurality of compressed test responses, a second input terminal connected to an IC pad of the second set of IO pads for receiving a masking signal of the plurality of masking signals, and an output terminal for outputting a masked signal based on a logic state of the masking signal when the integrated circuit is in the scan test mode; and
  a multiple input shift register (MISR) having a clock input terminal connected to the ATE, for receiving a tester clock signal, and a plurality of input terminals, wherein each of the plurality of input terminals is connected to a corresponding output terminal of a logic gate of the plurality of logic gates, for receiving masked signals generated by each of the plurality of logic gates and generating a signature such that a non-deterministic value of a compressed test response of the plurality of compressed test responses is masked when the integrated circuit is in the scan test mode;

a test control register connected to the scan controller for generating a test mode select signal to configure the second set of IO pads as at least one of input and output pads; and a first set of buffers, wherein each buffer of the first set of buffers has a first input terminal connected to a corresponding IO pad of the second set of IO pads for receiving a masking signal of the plurality of masking signals, a second input terminal connected to the test control register for receiving the test mode select signal, and an output terminal connected to the second input terminal of a corresponding logic gate of the plurality of logic gates for outputting the masking signal based on a logic state of the test mode select signal.

2. The integrated circuit of claim 1, wherein the scan controller further includes an inverter having an input terminal connected to the test control register for receiving the test mode select signal and an output terminal for outputting an inverted test mode select signal.

3. The integrated circuit of claim 2, further comprising a second set of buffers, wherein each buffer of the second set of buffers has a first input terminal connected to the compressor for receiving a compressed test response of the plurality of compressed test responses, a second input terminal connected to the output terminal of the inverter for receiving the inverted test mode select signal, and an output terminal connected to a corresponding IO pad of the second set of IO pads for outputting the compressed test response based on a logic state of the test mode select signal.

4. The integrated circuit of claim 3, wherein each buffer of the second set outputs a compressed test response of the plurality of compressed test responses when the test mode select signal is at logic low state, and wherein each IO pad of the second set of IO pads is configured as an output of the integrated circuit when the integrated circuit is in the functional mode.

5. The integrated circuit of claim 1, wherein each buffer outputs a masking signal of the plurality of masking signals when the test mode select signal is at a logic high state, and wherein each IO pad of the second set of IO pads is configured as an input to the integrated circuit when the integrated circuit is in the scan test mode.

6. The integrated circuit of claim 1, wherein the masked signal includes the compressed test response when the masking signal is at a logic high state and includes a logic low state signal when the masking signal is at a logic low state.

7. The integrated circuit of claim 1, wherein each logic gate of the plurality of logic gates comprises an AND gate.

8. The integrated circuit of claim 1, wherein each IO pad of the first and second sets of IO pads simultaneously receives a test pattern of the plurality of test patterns and a masking signal of the plurality of masking signals, respectively, in one tester clock signal cycle when the integrated circuit is in the scan test mode.

* * * * *